United States Patent
Jothikumar et al.

(10) Patent No.: US 9,230,678 B2
(45) Date of Patent: Jan. 5, 2016

(54) INTEGRATED CIRCUIT HAVING AN ENHANCED FUSELESS FUSE STRUCTURE, A METHOD OF MANUFACTURING THE SAME AND A DATA STRUCTURE FOR USE WITH THE FUSELESS FUSE STRUCTURE

(71) Applicant: Nvidia Corporation, Santa Clara, CA (US)

(72) Inventors: Sathish Jothikumar, Santa Clara, CA (US); Jesse Max Guss, Santa Clara, CA (US); Chen Hui, Shanghai (CN)

(73) Assignee: Nvidia Corporation, Santa Clara, CA (US)

( * ) Notice: Subject to any disclaimer, the term of this patent is extended or adjusted under 35 U.S.C. 154(b) by 125 days.

(21) Appl. No.: 14/153,643

(22) Filed: Jan. 13, 2014

(65) Prior Publication Data

US 2015/0200020 A1    Jul. 16, 2015

(51) Int. Cl.
*G11C 17/18* (2006.01)
*G11C 29/00* (2006.01)

(52) U.S. Cl.
CPC .............. *G11C 17/18* (2013.01); *G11C 29/789* (2013.01); *G11C 29/802* (2013.01); *Y10T 29/49155* (2015.01)

(58) Field of Classification Search
CPC ....... G11C 17/19; G11C 17/16; G11C 29/785
USPC .......................................... 365/225.7, 189.12
See application file for complete search history.

(56) References Cited

U.S. PATENT DOCUMENTS

2009/0190422 A1*   7/2009   Khoja .................... G11C 17/18
                                                                    365/200

* cited by examiner

*Primary Examiner* — Son Dinh

(57) ABSTRACT

An enhanced fuseless fuse structure is provided herein. Additionally, an IC with an enhanced fuseless fuse structure, a data structure that can be used with this structure and a method of manufacturing an IC are disclosed herein. In one embodiment, the IC includes: (1) a fuse wrapper configured to decode fuseless fuse data for controlling the fuses, (2) JTAG registers configured to store fuse register values in designated blocks, wherein the fuse register values and the designated blocks are determined from the fuseless fuse data and (3) options registers configurable by software to store fuse override data for modifying the fuse register values.

10 Claims, 2 Drawing Sheets

US 9,230,678 B2

INTEGRATED CIRCUIT HAVING AN ENHANCED FUSELESS FUSE STRUCTURE, A METHOD OF MANUFACTURING THE SAME AND A DATA STRUCTURE FOR USE WITH THE FUSELESS FUSE STRUCTURE

TECHNICAL FIELD

This application is directed, in general, to employing electronic fuses or fuseless fuses in an integrated circuit (IC) and, more specifically, to employing fuseless fuses to store options for features of the IC.

BACKGROUND

Fuses are a type of programmable ROM that are often utilized to store chip-specific information such as a stock-keeping-unit (SKU) configuration, calibration parameters, chip ID, RAM repair, etc. Earlier generations of chips used dedicated fuse bits in a fuse macro to store a particular feature. Automated Test Equipment (ATE) program would then be used to burn the fuses to select a feature.

Using the dedicated fuse bits had advantages with the ATE and in operations of the manufacturer since it was easy to convert a chip to a given SKU by burning specific bits in a fuse macro. The main disadvantage, however, was the lack of re-programmability; once a particular configuration for the chip was set, it could not be changed. Thus, human and programming errors could not be corrected and could lead to inventory backlogs and waste when errors occurred on a large scale. Accordingly, changes, such as fuse-based RAM repair, could not be supported in a flexible fashion under a fixed programming scheme.

SUMMARY

In one aspect, the disclosure provides an IC having fuses for configuring circuitry thereof. In one embodiment, the IC includes: (1) a fuse wrapper configured to decode fuseless fuse data for controlling the fuses, (2) JTAG registers configured to store fuse register values in designated blocks, wherein the fuse register values and the designated blocks are determined from the fuseless fuse data and (3) options registers configurable by software to store fuse override data for modifying the fuse register values.

In another aspect, the disclosure provides a non-transitory computer readable medium encoded with operating instructions that direct the operations of a processor, wherein the operating instructions include a data structure. In one embodiment, the data structure includes: (1) a first field that identifies a single serial register, (2) a second field that identifies a designated block within the single serial register and (3) a third field that includes data to be loaded into the designated block.

In yet another aspect, the disclosure provides a method of manufacturing an IC. In one embodiment, the method includes: (1) receiving, via a processor, a request for fuseless fuse options for a feature of the integrated circuit, (2) automatically initiating implementation of a fuseless fuse structure for the requested feature option and (3) constructing the fuseless fuse structure.

BRIEF DESCRIPTION

Reference is now made to the following descriptions taken in conjunction with the accompanying drawings, in which.

DETAILED DESCRIPTION

Figure 1:
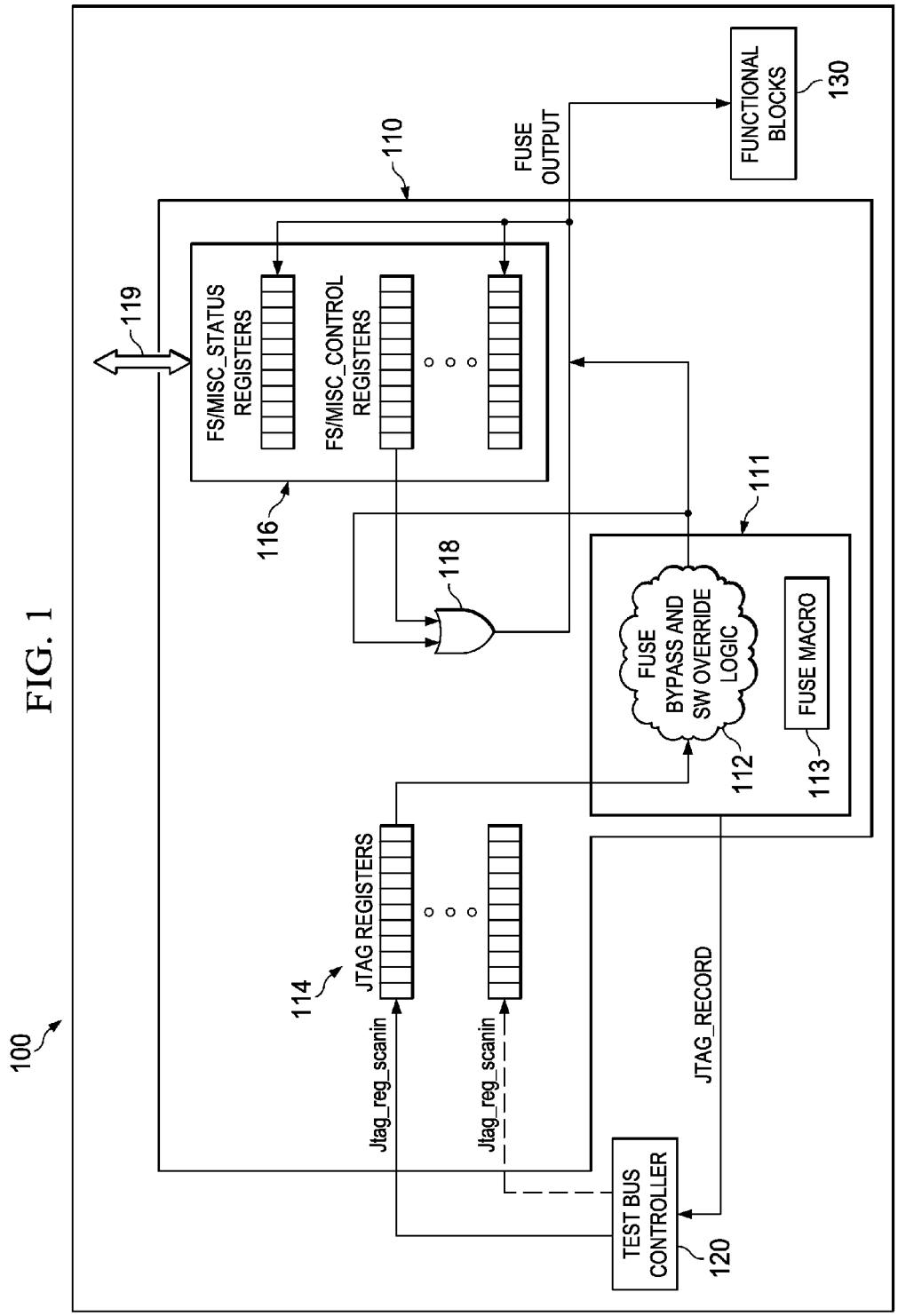
FIG. 1 illustrates a schematic diagram of an embodiment of an integrated circuit including a fuseless fuse structure constructed according to the principles of the disclosure.

To resolve these issues, a methodology for setting the configuration values was developed that uses a large group of fuse data to store records or instructions. The instructions did not have to be located in any specific region in the fuse group and the instructions could be invalidated and new instructions could be burnt to override the old ones. This methodology or scheme, sometimes referred to as fuseless fuses, provided improved flexibility in configuring the chip-specific information and invalidating errors in fuse programming.

In the fuseless fuse scheme, the fuse options for a particular configuration or feature of a chip were concatenated and moved to a dedicated JTAG register which is, in essence, a chain of registers used to store values. Rather than allocating dedicated fuse bits, the fuse macro was used to store instructions to program values onto these JTAG registers, using a set of chain IDs, offset and data values. Additionally, fuse logic was used to shift data through the JTAG controller rather than directly controlling the bits on the JTAG register.

While flexibility was increased, implementing the above fuseless fuse scheme created complications since it was no longer easy to set a chip, also referred to as an IC, in a given configuration by burning just one fuse present in a fixed location. Instead, multiple operations were involved in adding a fuseless fuse structure to an IC. All of the operations were manual and included updating multiple files, such as three configuration files and five Verilog files, which proved to be complicated and error prone.

Thus, the amount of manual work required to create independent JTAG chains to provide the flexible fuseless fuse structure for an IC was greatly increased compared to employing dedicated fuses. Additionally, any changes or additions to the bits in the JTAG chains required even more man hours to connect them again. Furthermore, the intelligence of the ATE program used to burn the fuses was increased to determine which type of instructions needed to be burnt and at which location the instructions needed to be burnt, as these were quite dynamic. Another difficulty with the fuseless fuse scheme was the lack of efficiency of storing fuse options for a particular feature.

The disclosure provides an improved fuseless fuse structure for an IC that allows automating the code generation and connections during the design of the IC to create the improved fuseless fuse structure for the IC via automation. Additionally, a novel data structure is disclosed that increases packing efficiency by allowing more fuse features to be stored as reprogrammable fuseless fuses without increasing the size of the fuse macro. In one embodiment, this is achieved by changing the data structure utilized for the instructions to program the values onto the JTAG registers. A block-based addressing scheme is also disclosed in an embodiment. With the increase of packing efficiency of fuses, storing more fuse options inside the fuses is allowed. Furthermore, additional logic is disclosed that allows overriding of the values on the JTAG chains. As noted below with respect to FIG. 1, this logic is located in a fuse wrapper. This not only allows easier integration into the existing flow, but also allows a software solution for modifying features of an IC, such as modifying the floorsweeping configuration of a chip. The other enhancements to the fuseless fuse structure simplifies tying new fuse configurations with the fuses and reduces not only the sources of error but also the amount of time spent managing all the fuseless fuse options.

FIG. 1 illustrates a schematic diagram of an embodiment of an IC 100 constructed according to the principles of the disclosure. The IC 100 includes a fuseless fuse structure 110, JTAG logic 120, and functional blocks 130. The fuseless fuse structure 110 is an architecture within the IC 100 that includes a combination of registers, including software accessible registers, and logic configured to provide fuse options for various features or configurations (referred to herein collectively as features) of the IC 100. The fuseless fuse structure 110 includes a fuse wrapper 111, fuse logic 112, a fuse macro 113, JTAG registers 114, options registers 116 and logic circuitry 118. The various components of the fuseless fuse structure 110 are connected via buses typically included within an IC. A software bus 119 is also denoted in FIG. 1 that provides an external connection to the options registers 116. The software bus 119 allows reading and writing to the options registers 116. In one embodiment, the software bus 119 is coupled to a main processor associated with the IC 100.

The fuse macro 113 includes an array of fuses. In some embodiments the fuse macro 113 is a library cell, typically provided by the fabrication vendor, having an array of fuses. The fuseless fuse structure 110, reads the value of the fuses in the fuse macro 113, and controls the setting of fuse options to obtain the desired option for the various features or to repair damage bits of the IC 100, such as with RAM repair. Setting of the fuses can be done post-silicon to obtain a particular feature for the IC 100. In one embodiment, the fuses or one of the fuses of the fuse macro 113 are set by the manufacturer post-silicon. ATE can be employed to indirectly control the fuses of the fuse macro 113 through JTAG programming via a test interface (not illustrated) on the IC 100. For example, ATE can be connected to a test interface of the IC 100, which is connected to a test bus controller of the JTAG logic 120, which is connected to the fuse wrapper 111 and the fuse macro 113.

The fuses of the fuse macro 113 correspond to functional blocks that represent the various options for features of the IC 100. Setting or blowing particular ones of the fuses is typically determined external to the IC 100. The fuseless fuse structure 110 decodes what has been burnt in the fuses of the fuse macro 113 and sets the value for the various options for features of the IC 100. Thus, the fuseless fuse structure 110 decodes values that represent the various options from the values stored in the fuses of the fuse macro 113 for the different features of the IC 100. This provides flexibility for programming the various features instead of employing a single dedicated fuse for a particular feature.

In one embodiment, the fuseless fuse structure 110 is automatically constructed via a fuse script file in response to requests for feature options during the design process of the IC 100. The requested options for various features of the IC 100 are fuse-controlled configuration options for the IC 100. The fuse script file automatically updates the necessary files, such as an RTL file, during the design process of the IC 100 to implement the requested fuse-controlled configuration options in silicon. The fuse script file can run at different intervals during the design process to update the necessary files for the design of the IC 100. In some embodiments, the script file is run each night during the design process. The various files updated by the script file include configuration files and hardware description language (HDL) files such as Verilog files. The number and type of files updated by the script file during the design of the IC 100 can vary depending on the manufacturer.

The fuse wrapper 111 is configured to generate fuse output data for various features of the IC 100. The fuse wrapper 111 includes the fuse macro 113 that is instantiated by the fuse script file in response to requests for fuses during design of the IC 100. The fuses of the fuse macro 113 are conventional fuses that are used to store conventional fuses and fuseless fuse data as a data structure such as the data structure in FIG. 2. Thus the fuse macro 113 is used to keep track of the raw fuse values of the IC 100.

The fuse wrapper 111 is configured to decode fuseless fuse data stored in the fuses of the fuse macro 113 in the form of a data structure. The decoded fuseless fuse data is provided to and utilized by the JTAG logic 120 to program fuse register values onto the JTAG registers 114. In one embodiment, the data structure is the data structure of FIG. 2.

In addition to providing fuse register values for the JTAG registers 114, the fuse wrapper 111 also includes Fuse Bypass and SW Override logic 112 (i.e., logic 112) that is configured to override the fuse register values of the JTAG registers 114 with fuse override data stored in the options registers 116. The fuse override data can be loaded into the options registers 116 via the software bus 119. In one embodiment the override and bypass operations are performed via software. Thus, the fuse wrapper 111 includes the necessary circuitry and/or software to decode the fuseless fuse data for setting fuse register values in the JTAG registers 114 and for overriding or bypassing the fuse register values with the fuse override data of the options registers 116.

The JTAG logic 120 places the fuse register values in the designated block of the designated JTAG register 114. The JTAG logic 120, therefore, is configured to translate or decode the fuseless fuse data from the fuse wrapper 111 to place the fuse register values from the fuseless fuse data in the designated location of the various JTAG registers 114. In one embodiment, the JTAG logic 120 includes conventional logic used to load JTAG chains including a test bus core and test bus controller. As indicated above, in one embodiment the fuseless fuse data is formed into the data structure of FIG. 2 that addresses the JTAG registers 114 in a block-based addressing scheme. Accordingly, the JTAG logic 120 shifts the fuse register values along the identified chain from the fuseless fuse data to the designated block of bits within the chain.

Figure 3:
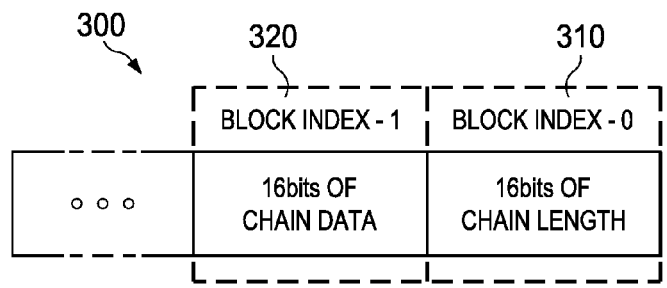
FIG. 3 illustrates a diagram of an embodiment of a JTAG register employing the block-based addressing scheme according to the disclosure.

The JTAG registers 114 are JTAG chains that are configured to store the fuse register values in designated blocks determined from the fuse data. FIG. 3 provides an example of a JTAG register employing a block-based addressing scheme. The JTAG registers 114 are serially loaded with the fuse register values by the JTAG logic 120.

The options registers 116 are software accessible registers that store fuse override data for modifying the fuse register values. Selecting of the options registers 116 is controlled by the fuse wrapper 111, i.e., by the logic 112 thereof. The options registers 116 store values, the fuse override data, that can be read and acted on by the logic 112, with the logic circuitry 118, to provide the desired functional implementation for the IC 100. The fuse register values from the JTAG registers 114 can be overwritten by the logic 112 to provide the desired functional implementation according to the fuse override data of the options registers 116.

The options registers 116 therefore include the fuse override data that can be used for overriding the fuse data of the fuse macro 113 for a feature. Each of the options registers 116 correspond to a particular feature of the IC 100. In one embodiment, the features are requested during the design process of the IC 100 and are implemented via the fuse script file. Three options registers 116 are illustrated in FIG. 1. Two are specifically denoted for floorsweeping, i.e., FS/MISC_STATUS and FS/MISC_CONTROL. Other examples of features in which the options registers 116 store values for include SKU, calibration parameters, chip ID and Ram repair. One skilled in the art will understand that multiple options registers 116 can be employed by the IC 100. Additionally, one skilled in the art will understand that the IC 100 can include additional registers typically located within an IC that are also addressable via the software bus 119.

As an example, consider a floorsweeping fuse "FS_A" of the IC 100. The fuse script file allocates a range of bits in the JTAG register 114 for FS_A. The fuse script file will also generate two registers FS_A CONTROL and FS_A STATUS in the registers of the options registers 116. The fuse FS_A can be burnt, e.g., as the data structure in FIG. 2, in the fuses of the fuse macro 113 via ATE and a JTAG interface.

During the bootup process of the IC 100, the JTAG logic 120 would decode the fuseless fuse data from the data structure and load the value out onto specific bits on the JTAG register 114.

The Fuse Bypass and SW Override logic 112 can then override or bypass the data from the JTAG registers 114 with fuse override data from the FS_A CONTROL register of the options registers 116 to create the final value that is provided as the fuse output data to functional blocks 130. The fuse output data is also provided by the illustrated bus to the options registers 116 as feedback. This allows the fuse output data to be stored and read by the main processor via the software bus 119.

The logic circuitry 118 is combinational logic that combines instructions from the fuse wrapper 111 with fuse override data from the options registers 116 to provide fuse output data to set the appropriate fuse feature of the IC 100 for the desired option. The logic circuitry 118 combines instructions from the fuse wrapper 111 with values coming from registers 116, such as the FS A Control values, through the logic circuitry OR gate/mux 118 to provide the final fuse output data that goes to Functional blocks 130.

In one embodiment the fuse wrapper 111 functions continuously, but in some embodiments does its main work during the IC bootup process. As noted in the above example, the logical activity described can happen during the booting process of the IC 100.

The fuse output data is used to control functionality of the IC 100. The fuse output data can be used to disable or enable blocks of the IC 100, characterize various sensors of the IC 100, provide a premium feature of the IC 100, repair RAM, floorsweeping, etc. The fuse output data is used to obtain a configuration to perform the desired option for a feature.

The functional blocks 130 are blocks of circuitry that are designed to perform a particular function for the IC 100. In one embodiment, each of the functional blocks 130 represents a usage model for the particular option of a feature for the IC 100.

Figure 2:
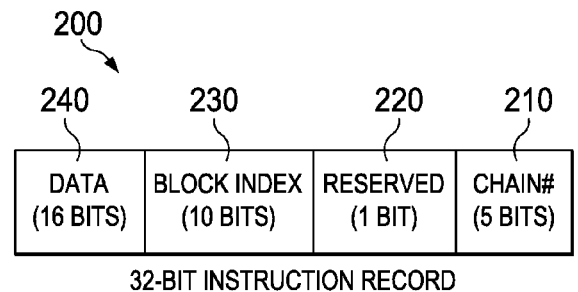
FIG. 2 illustrates a diagram of an embodiment of a data structure used to program the JTAG registers of the fuseless fuse structure of FIG. 1.

FIG. 2 illustrates a diagram of an embodiment of a data structure 200 for an instruction that is used to program the JTAG registers of the fuseless fuse structure of FIG. 1. The data structure 200 is an instruction with a 32 bit record structure that includes fuse options for a particular feature of the IC 100. In the illustrated embodiment, the 32 bit width of the data structure 200 corresponds to the width of a fuse macro, such as the fuse macro 113. One skilled in the art will understand that the width of the data structure can vary in different embodiments. The data structure 200 includes fields that identify the JTAG register, the block location within that register and the data, i.e, fuse register values, to store or overwrite in the designated block location. More specifically, the data structure 200 includes the following fields: Chain #210, Reserved 220, Block Index 230 and Data 240. The Chain #210 is a 5 bit field that points to the particular one of the JTAG registers 114 in which the fuse register values in the Data 240 field are to be pushed. The Reserved 220 field is a single bit field that is provided for extra functionality. The Reserved 220 field can be utilized to provide additional functionality in the design of the IC 100 including implementing a feature to store software programming in the fuse macro of the fuse wrapper 111 as a backup feature.

The Block Index 230 field indicates which block of the identified one of the JTAG registers 114 to store the fuse register values from the Data 240 field. In the illustrated embodiment, the JTAG registers 114 are divided into non-overlapping blocks of 16 bits each. The Block Index 230 refers to a specific block within the identified JTAG register in which the 16 bit data from the Data 240 field is to be written. For this embodiment, a Block Index 230 of "0" refers to the least significant 16 bits of the JTAG registers 114. FIG. 3 illustrates a JTAG chain employing the block based addressing of the data structure 200. Employing the block based addressing scheme allows access to JTAG chains twice as long as conventional data structures that are being used. For example, a JTAG register of 16,384 bits can now be employed with the block-based addressing scheme in one implementation.

The Data 240 field is a 16 bit field that includes the fuse register values. By employing a 16 bit data field, the data packing efficiency of the data structure 200 is 50 percent (i.e., bits of the 32 bit instruction format). This allows more fuseless fuse data to be packed into the fuse macro, allowing support for even more features to be stored into the fuse macro and increasing the number of retrials for the same size of fuse macro. This can reduce wastage since the lack of space resulted in some features remaining as legacy fuses and may result in increased wastage due to possible mistakes in programming those legacy fuses. By making the fuses reprogrammable, this wastage can be reduced and inventory management becomes easier. For example, in some embodiments the proposed extra fuse options to be added as fuseless fuses would have resulted in an increase to the fuse macro size at a cost of an extra $0.15=^2$ if the packing efficiency was not improved to 50 percent.

FIG. 3 illustrates a diagram of an embodiment of a JTAG register 300 employing the block-based addressing scheme according to the disclosure. The JTAG register 300 or chain can be anyone of the JTAG registers 114 in FIG. 1. The JTAG register 300 includes two blocks that are specifically indicated. One skilled in the art will understand that the JTAG register 300 includes additional blocks.

In FIG. 3, a first block 310 and a second block 320 are identified. The first block 310 is Block Index—0 and it refers to the least significant bits of the JTAG register 300. The second block 320 is Block Index—1 and it refers to the next least significant 16 bits of the JTAG register 300. The first 16 bits of the JTAG register 300 contain the length thereof and are not programmed but only read. When fuse data from the fuse wrapper 111 is decoded by the JTAG logic 120 with a block index n of JTAG register 300, then the JTAG logic 120 loads the 16 bits of fuse register values into block n of the JTAG register 300. As indicated in FIG. 3, 16 bits of fuse data was loaded into block 1.

Figure 4:
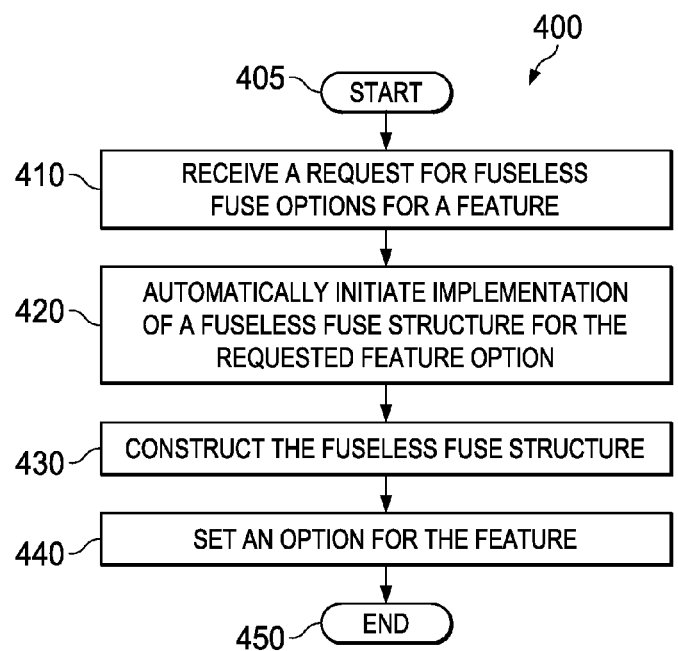
FIG. 4 illustrates a flow diagram of an embodiment of a method of constructing an integrated circuit carried out according to the principles of the disclosure.

FIG. 4 illustrates a flow diagram of an embodiment of a method 400 of constructing an IC carried out according to the principles of the disclosure. The method 400 or at least a portion thereof is carried out by a processor. In one embodiment, a processor is directed by a fuse script file to perform at least some of the steps in the method. The method 400 begins is a step 405.

In a step 410, a request for fuseless fuse options for a feature of the IC is received. The request may be generated by a design team responsible for a particular portion of the IC. In one embodiment the request is received by a processor.

In a step 420, implementation of a fuseless fuse structure for the requested feature option is automatically initiated. Automatic implementation begins by updating the various files that are needed during the design process to construct circuitry for the IC. For example, the RTL file for the IC is automatically updated to include the requested fuseless fuse structure. In some embodiments, a script file is used for the implementation process. In these embodiments, the script file, referred to as a fuse script file with respect to FIG. 1, activates the necessary design files, such as an RTL file, to implement the fuseless fuse structure in the IC. In some embodiments, initiation by the fuse script file includes activating and communicating with conventional EDA tools.

The fuseless fuse structure is constructed in a step 430. The fuseless fuse structure is constructed employing conventional tools such as EDA tools and according to the conventional design flow. Continuing with the above example, once the RTL design is updated via the fuse script file, a conventional design process can be used to fabricate the IC in silicon, wherein the IC includes the fuseless fuse structure. The IC can be fabricated as part of a wafer.

In a step 440, an option for a feature or options for features are set. In one embodiment, step 440 occurs post-silicon employing the fuseless fuse structure. An example of a fuseless fuse structure for multiple features is the fuseless fuse structure 110 of FIG. 1. ATE can be employed to set the various feature options by blowing or setting a fuse post-fabrication. In some embodiments, wafer testing can be used to indicate which fuse or fuses need to be set. When ATE blows fuseless fuses, the ATE can employ the data structure 200. For setting fuses, the ATE procedure has a flow that considers various factors such as results from wafer testing, requirements from the marketing team, etc., to decide what feature options need to be set post-fabrication. The method 400 ends in a step 450.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

A portion of the above-described apparatuses, systems or methods may be embodied in or performed by various processors, such as conventional digital data processors or computing devices, wherein the processors are programmed or employ stored executable programs of sequences of software instructions to perform one or more of the steps of the methods. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computing devices to perform one, multiple or all of the steps of one or more of the above-described methods, or functions of the apparatuses described herein.

Portions of disclosed embodiments may relate to computer storage products with a non-transitory computer-readable medium that have program code thereon for performing various computer-implemented operations that embody a part of an apparatus, system or carry out the steps of a method as set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Those skilled in the art to which this application relates will appreciate that other and further additions, deletions, substitutions and modifications may be made to the described embodiments.

What is claimed is:

1. An integrated circuit having fuses for configuring circuitry thereof, said integrated circuit comprising:
   a fuse wrapper configured to decode fuseless fuse data for controlling said fuses;
   JTAG registers configured to store fuse register values in designated blocks, wherein said fuse register values and said designated blocks are determined from said fuseless fuse data; and
   options registers configurable by software to store fuse override data for modifying said fuse register values.

2. The integrated circuit as recited in claim 1 wherein said fuseless fuse data is an instruction for programming said fuse register values onto said JTAG registers, wherein said instruction has a data structure with a data packing efficiency of 50 percent.

3. The integrated circuit as recited in claim 2 wherein said data structure employs a block-based addressing scheme for said JTAG registers.

4. The integrated circuit as recited in claim 2 wherein said data structure includes a data field, a block index field and a chain number field.

5. The integrated circuit as recited in claim 1 further comprising JTAG logic configured to determine said blocks from said fuseless fuse data and load said fuse register values from said fuse data to said determined blocks.

6. The integrated circuit as recited in claim 1 wherein said fuse wrapper includes logic configured to override said fuse register values on said JTAG registers.

7. The integrated circuit as recited in claim 6 wherein said fuse wrapper is configured to override said fuse register values on said JTAG registers with said fuse override data of said options registers.

8. The integrated circuit as recited in claim 1 wherein at least one of said options registers corresponds to a feature of said IC.

9. The integrated circuit as recited in claim 1 wherein said fuse wrapper is further configured to select an option for said feature after fabrication of said integrated circuit and generate fuse output data to set a fuse that corresponds to said option.

10. The integrated circuit as recited in claim 1 further comprising combinational logic coupled to said fuse wrapper and said options registers, said combinational logic configured to generate fuse output data based on inputs from said options registers and from said fuse wrapper, wherein said fuse output data configures said IC.

\* \* \* \* \*